US012688886B2

(12) United States Patent
Tomaiuolo et al.

(10) Patent No.: US 12,688,886 B2
(45) Date of Patent: Jul. 21, 2026

(54) METHOD OF OPERATING PHASE CHANGE MEMORIES, CORRESPONDING DEVICE AND COMPUTER PROGRAM PRODUCT

(71) Applicant: STMicroelectronics International N.V., Geneva (CH)

(72) Inventors: Francesco Tomaiuolo, Acireale (IT); Marco Ruta, San Gregorio di Catania (IT); Michelangelo Pisasale, Catania (IT); Marion Helne Grimal, Catania (IT); Luigi Buono, Gravina di Catania (IT); Antonino Conte, Tremestieri Etneo (IT); Diego De Costantini, Augusta (IT); Marco Eugenio Gibilaro, Aci Castello (IT)

(73) Assignee: STMicroelectronics International N.V., Geneva (CH)

( * ) Notice: Subject to any disclaimer, the term of this patent is extended or adjusted under 35 U.S.C. 154(b) by 71 days.

(21) Appl. No.: 18/769,493

(22) Filed: Jul. 11, 2024

(65) Prior Publication Data

US 2025/0022509 A1      Jan. 16, 2025

(30) Foreign Application Priority Data

Jul. 14, 2023    (IT) ......................... 102023000014754

(51) Int. Cl.
*G11C 13/00* (2006.01)

(52) U.S. Cl.
CPC ...... *G11C 13/0064* (2013.01); *G11C 13/0004* (2013.01); *G11C 13/0069* (2013.01)

(58) Field of Classification Search
CPC ............ G11C 13/0064; G11C 13/0004; G11C 13/0069; G11C 2013/0042; G11C 2013/0078; G11C 2013/0088; G11C 13/0023; G11C 13/003; G11C 13/0033; G11C 13/0061; G11C 2013/0066
See application file for complete search history.

(56) References Cited

U.S. PATENT DOCUMENTS

| | | | |
|---|---|---|---|
| 2009/0161417 A1 | 6/2009 | Fackenthal et al. | |
| 2013/0021845 A1* | 1/2013 | Eleftheriou | G11C 13/0004 365/163 |
| 2017/0178722 A1* | 6/2017 | Pasotti | G11C 13/0028 |
| 2020/0066335 A1* | 2/2020 | Chih | G11C 11/1697 |
| 2023/0176750 A1 | 6/2023 | Aoki | |
| 2023/0187013 A1 | 6/2023 | Gherman | |

OTHER PUBLICATIONS

IT Search Report and Written Opinion for priority application, IT Appl. No. 102023000014754, report dated Jan. 16, 2024, 7 pgs.

* cited by examiner

*Primary Examiner* — Xiaochun L Chen
(74) *Attorney, Agent, or Firm* — Crowe & Dunlevy LLC

(57) ABSTRACT

A Phase Change Memory (PCM) device includes sets of cells in which a binary logic level is written by a write operation. Each cell is included in a respective set of cells in the sets of cells. The write operation includes: performing write verify operations on the cells to identify an actual logic level stored in the cells; checking if the identified actual logic level matches a certain the binary logic level; in response to the checking determining that in at least one cell the actual logic level fails to match the binary logic level, correcting the actual logic level to match the binary logic level by performing: a set write operation in case the binary logic level is a high logic level, or a reset write operation in case the binary logic level is a low logic level.

19 Claims, 5 Drawing Sheets

METHOD OF OPERATING PHASE CHANGE MEMORIES, CORRESPONDING DEVICE AND COMPUTER PROGRAM PRODUCT

PRIORITY CLAIM

This application claims the priority benefit of Italian Application for Patent No. 102023000014754 filed on Jul. 14, 2023, the content of which is hereby incorporated by reference in its entirety to the maximum extent allowable by law.

TECHNICAL FIELD

The description relates to the field of data storage technologies.

One or more embodiments can be applied to computer storage technologies such as Phase Change Memory (PCM), for instance, embedded Phase Change Memory (ePCM) and/or Non-Volatile Memory ePCM (ePCM NVM).

BACKGROUND

Phase Change Memories (PCM) are a type of computer storage technology, that is, memory technology and, generally, a type of non-volatile random-access memory technology that may be embedded in integrated circuit (IC) semiconductor devices.

Usually, PCM operates on a bit-by-bit basis since the heat produced by an electric current flowing through a heating material called phase-change material such as, for instance, a chalcogenide glass, is used to melt and quench the phase-change material, making it amorphous, or to hold such phase-change material in its crystallization temperature range, thereby switching it to a crystalline state.

Therefore, a PCM storage unit may use such phase-change material to store 1-bit of information since the two states of the phase-change material, that is, amorphous or crystalline, are characterized by different resistance values that facilitate distinguishing one of the states from the other, that is, each of the two states corresponds to a different value of a single bit.

Thus, the phase-change material can stably exist in two states: an amorphous or disordered state, characterized by high electrical resistivity, that is, by high resistance, for instance, about 0.6 M (2, representing, for instance, a low logical state, for instance, '0', characterized by a low current flowing through it; or a crystalline or ordered state, characterized by low electrical resistivity, that is, by low resistance, for example, a resistance lower than that of the amorphous state, for instance, about 18 k (2, representing, for instance, a high logical state, for instance, '1', characterized by a high current flowing through it.

A PCM storage unit can switch between such two states by differently heating the phase-change material, that is, by applying a current to such phase-change material for a given time for switching to a first state and by applying a current of different value to such phase-change material for a different time for switching to a second state.

For instance, a "set" write operation of a specific cell, that is, setting the cell to a high logic level, may be performed by applying on the phase-change material of such specific cell a current that heats the respective phase-change material above a crystallization temperature associated to such respective phase-change material, but under a melt temperature associated with the same phase-change material, for a given time.

For instance, a "reset" write operation of a specific cell, that is, setting the cell to a low logic level, can be performed by applying on the phase-change material of such specific cell a current that heats the respective phase-change material above the melt temperature associated with such respective phase-change material for a given time, for instance, shorter than the one considered in a "set" write operation.

For instance, a read operation of a specific cell may be done by testing the resistance value, for instance, through a current pulse, of the phase-change material of the specific cell in order to detect the present phase, that is, amorphous or crystalline, of the phase-change material.

It is noted that "set" write operations and "reset" write operations will be collectively referred to as write operations in the following description, therefore, a write operation performed on a given cell may be either a set write operation, that is, to set such given cell to a high logic level, or a reset write operation, that is, to set such given cell to a low logic level.

It is noted that after any write operation, a write verify operation is usually performed, that is, a read operation used to check the success of a corresponding write operation. If the write verify operation is considered successful, that is, if the read operation used to check the success of the corresponding write operation is considered successful, that is, if the read operation detects that a cell associated with such corresponding write operation contains the correct value that should be written in such cell, the corresponding write operation ends as the value contained in the cell is correct, thus, the write operation was successful. On the other hand, if the write verify operation is considered unsuccessful, that is, if the read operation detects that a cell associated with such corresponding write operation contains a value that is different from the correct one that should be written in such cell, the write operation is to be applied again, that is, a current is applied again to the cell in order to repeat the write operation.

A single-ended PCM is a type of PCM wherein a single cell corresponds to a single bit (that is, 1 cell/bit). Read operations in single-ended PCM are performed by using a reference current supplied, for instance, by a reference current generator, and a sense amplifier receiving: at one terminal, a current from a PCM cell that is to be read; and at the other terminal, a reference current supplied by the reference-current generator.

United States Patent Application Publication No. 2009/0161417 A1, incorporated by reference, discloses two-cells-per-bit PCM architecture (that is, 2 cell/bit), that is, PCM architecture wherein two cells contain a single bit of data and one of the two cells, a complementary cell, is programmed to the complementary state of the other of the two cells. Thus, a bit is determined by reading a bit stored in one of the two cells and comparing it to the one stored in the complementary cell, thus, performing a differential reading operation.

A differential reading operation considers both the stored value of such data in a cell in its direct form, that is, high or low logic level respectively, and the stored value of such data in a complementary cell in its complemented form, that is, low or high logic level respectively, hence, the result of the differential reading operation is obtained through the use of a sense amplifier that is configured to receive at one terminal a current of the "direct" cell that has to be read, that is, containing the data in the direct form, and at the other terminal a current of the associated complementary cell, that is, containing the data in the complemented form.

Therefore, the sense amplifier is configured to compare the current received from the direct cell and the current received from the associated complementary cell. If the current received from the direct cell is higher than the current received from the associated complementary cell, the sense amplifier is configured to read a logic level equal to 1 ("one"), that is, a high logic level. Otherwise, if the current received from the direct cell is lower than the current received from the associated complementary cell, the sense amplifier is configured to read a logic level equal to 0 ("zero"), that is, a low logic level.

As a result, a reading operation of a bit in a two-cells-per-bit PCM may be more reliable than reading operations of bits in single-ended PCMs, as a read window in two-cells-per-bit PCMs is twice as wide as that used in single-ended PCMs.

The read window in two-cells-per-bit PCMs depends on a difference between a current flowing in a direct cell and a current flowing in an associated complementary cell, which corresponds to a difference between a current flowing within a cell set to a high logic level, that is, a current flowing in a direct or in a complementary cell, and a current flowing in a cell set to a low logic level, that is, a current flowing in a complementary or in a direct cell respectively.

Conversely, the read window in single-ended PCMs depends on a difference between a current flowing in a cell, that is, a current flowing within a cell set to a high or a low logic level, and a reference current, such reference current being midway between a current flowing within a cell set to a high logic level and a cell set to a low logic level.

Hence, two-cells-per-bit PCM architectures improve the reliability of read operations as a reference current is not needed since read operations are based on differential readings and as the two-cells-per-bit read window is doubled.

In addition, two-cells-per-bit PCM architectures may usually provide higher robustness, reliability, and retention than single-ended PCM architectures as two-cells-per-bit PCMs are characterized by: redundancy of information, that is, a single bit is stored in two cells instead of a single one; and the possibility of implementing a differential reading strategy, that is, allowing the reading of the content of cells without using a reference current.

Such differential reading strategy further allows avoiding problems related to a relaxation phenomenon affecting amorphous materials of PCM cells, which leads to an unfeasibility in selecting a reference current that is constant during the entire working life of a single-ended PCM cell.

FIG. 1 illustrates a conventional structure of a two-cells-per-bit PCM array 10.

A PCM array 10, for instance, a two-cells-per-bit PCM array or a single-ended PCM array, comprises a set of cells, for instance, comprising cells $100_{i-1, j}$, $100_{i, j}$, $100_{i+1, j}$, and $100_{i+2, j}$ of FIG. 1, that are collectively referred to with the reference 100, coupled together.

It is noted that the resistances of FIG. 1 are not physical elements but arise from parasitic connections.

The set of cells 100 illustrated in FIG. 1 is comprised in a word line $WL_j$ and each of such cells 100 is further coupled with a respective bit line, for instance, to a bit line $BL_{i-1}$, $BL_i$, $BL_{i+1}$, or $BL_{i+2}$ of FIG. 1, that are collectively referred to with the reference BL.

Both a current received from a direct cell and a current received from an associated complementary cell depend on voltages that are applied respectively on the direct cell and the complementary cell.

Such voltages applied on direct and complementary cells cannot be defined precisely in advance as such voltages: are portions of higher voltages that are applied on corresponding bit lines BL, that is, bit lines to which such direct and complementary cells are coupled; and depend both on the number of cells that are read in parallel in the same tile, that is, the same portion of a PCM memory wherein the cells are placed both along the bit line BL and the word line $WL_j$ and at the same time and on the current flowing within each of the cells.

The number of cells read in parallel in the same tile and at the same time changes the value of the voltages applied to each of such cells, and, as a consequence, the value of the currents flowing within each of such cells.

Such changes in the values of the voltages and currents are due to the following elements: low values, for example around 0.45, of beta parameters, that is, indicating a relationship between collector currents (output currents) and base currents (input currents), of bipolar transistors used as selectors of the cells in the PCM memory; and word line IR drops, that is, voltage drops caused by currents flowing through parasitic resistors.

Solutions to reduce current variations within cells are thus desirable in order to facilitate write verify operations, that is, operations to check the success of write operations.

There is a need in the art to contribute in providing such a solution.

SUMMARY

One or more embodiments concern a method for performing a PCM write operation.

One or more embodiments concern a corresponding memory device and a corresponding computer program product loadable in at least one processing circuit (for instance, a computer) and comprising software code portions for executing the steps of the method when the product is run on at least one processing circuit. As used herein, reference to such a computer program product is understood as being equivalent to reference to a computer-readable medium containing instructions for controlling a processing system in order to co-ordinate implementation of the method according to one or more embodiments.

Solutions as described herein include a method for performing PCM write operations, that is, to write a word comprising one or more bits, including write verify operations, in a Phase Change Memory (PCM) device, the PCM device comprising a plurality of groups ("sets") of cells configured to have written therein, in response to a write operation, for instance, a set write operation or a reset write operation, a binary logic level selected from a high logic level and a low logic level, wherein each cell is included in a respective group ("set") of cells in the plurality of groups ("sets") of cells.

Embodiments of the method as described herein comprise at least the following steps: performing, on the cells in such plurality of groups ("sets") of cells, write verify operations configured to provide results indicative of an actual logic level stored in the cells in such plurality of groups ("sets") wherein the write verify operations are performed on each cell with a set of parameters selected as a function of the respective group ("set") of cells including the cell; checking, based on the results from such write verify operations, if the actual logic level stored in the cells in such plurality of groups ("sets") matches such binary logic level; and in response to such checking determining that in at least one cell in such plurality of groups ("sets") the actual logic level fails to match such binary logic level, correcting such actual logic level to match such binary logic level via: a set write operation in case the binary logic level is a high logic level, or a reset write operation in case the binary logic level is a low logic level.

Solutions as described herein facilitate reducing current variations within cells in order to facilitate write verify operations, that is, operations to check the success of write operations, achieving write operations with increased performances.

BRIEF DESCRIPTION OF THE DRAWINGS

One or more embodiments will now be described, by way of example only, with reference to the annexed figures, wherein.

DETAILED DESCRIPTION

Figure 1:
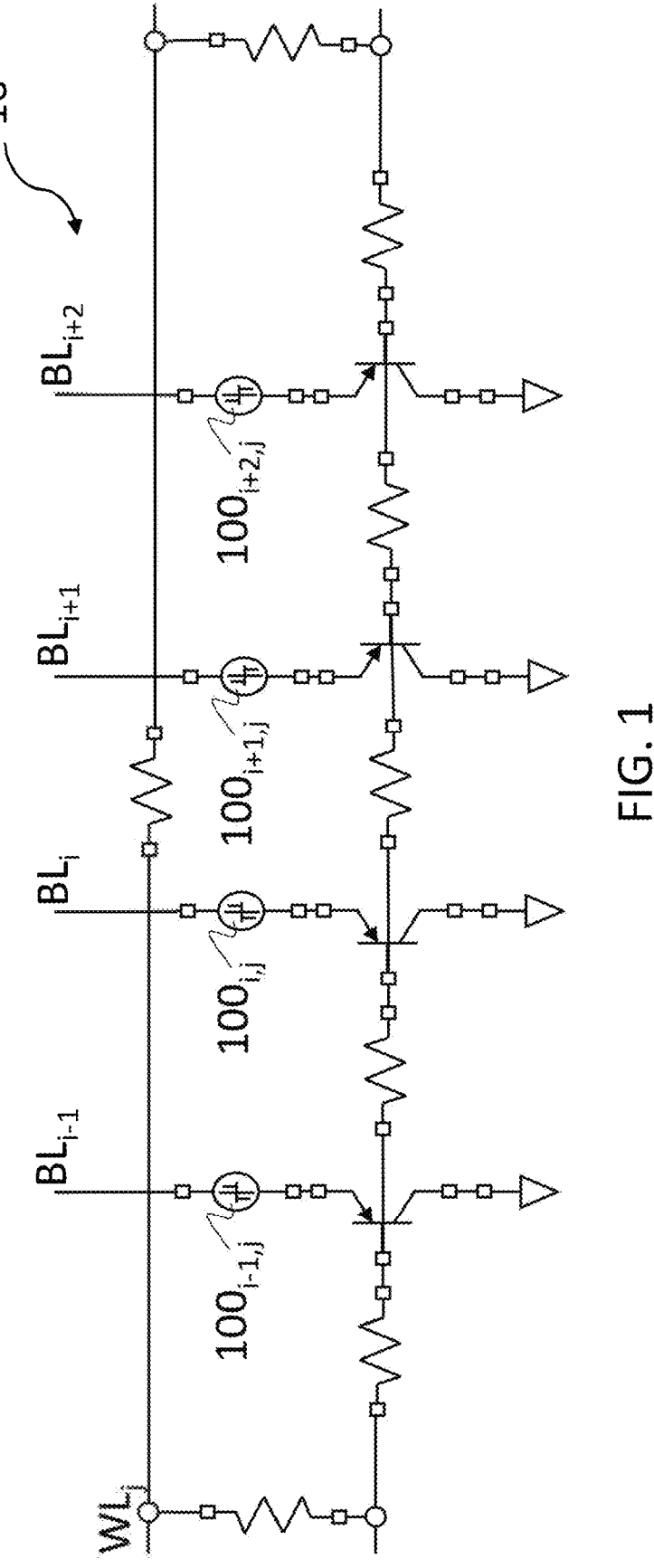
FIG. 1 is a conventional structure of a PCM array.

Corresponding numerals and symbols in the different figures generally refer to corresponding parts unless otherwise indicated.

The figures are drawn to clearly illustrate the relevant aspects of the embodiments and are not necessarily drawn to scale.

The edges of features drawn in the figures do not necessarily indicate the end of the extent of the feature.

In the ensuing description one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment.

Moreover, particular configurations, structures, or characteristics may be combined in any adequate way in one or more embodiments.

The headings/references used herein are provided merely for convenience and hence do not define the extent of protection or the scope of the embodiments.

For simplicity and ease of explanation, throughout this description, and unless the context indicates otherwise, like parts or elements are indicated in the various figures with like reference signs, and a corresponding description will not be repeated for each and every figure.

As previously described, solutions as disclosed herein aim at reducing current variations within cells of two-cells-per-bit PCMs in order to facilitate write verify operations, that is, operations to check the success of write operations.

It is noted that in two-cells-per-bit PCMs the effects of word line IR drops, that is, voltages drop caused by currents flowing through parasitic resistors, during a read operation are about constant considering that if the number of sense amplifier in a given tile is equal to a number N, the number of cells read in parallel storing high logic levels, that is, corresponding to high currents flowing within such cells, and the number of cells read in parallel storing low logic levels, that is, corresponding to low currents flowing within such cells, are equal to such number N (that is, each sense amplifier corresponds to a cell that stores a high logic level, for instance, a direct or a complementary cell, and a cell that stores a low logic level, for instance, a complementary or a direct cell respectively).

Nevertheless, such effects of word line IR drops change among different write verify operations since such effects depend on the state of the cells during the performance of write verify operations, for instance, resulting in a lowering of the accuracy of cycles of write verify operations wherein each of such write verify operations is affected by a different contribution of such word line IR drops.

A write operation in two-cells-per-bit PCMs may include at least two phases that can be performed in any order and repeated any number of times: a verify phase, wherein currents flowing within each of the cells involved in the write operation are compared with one or more reference currents in order to decide if each of such cells has to receive a write current pulse or not; and a set and reset pulse phase, wherein each of the cells that are involved in the write operation and in a state different from a desired one receives one or more set or reset pulses.

The verify phase may comprise one or more of the following subphases:

a direct cell set verify subphase, wherein each current flowing in a direct cell that is to be set to a high logic level is compared with a direct set verify reference current, for instance, with a value of about 8 $\mu$A (micro), to check if each of the direct cells that are to be set to the high logic level is correctly set to such logic level, that is, to check if the current flowing within each of the direct cells that are to be set to the high logic level is higher than such direct set verify reference current, for instance, Icell>8 $\mu$A wherein Icell is the current flowing within each of such direct cells;

a complementary cell set verify subphase, wherein each current flowing in a complementary cell that is to be set to a high logic level is compared with a complementary set verify reference current, for instance, of a value equal to the direct set verify reference current, that is, about 8 $\mu$A, to check if each of the complementary cells that are to be set to the high logic level is correctly set to such logic level, that is, to check if the current flowing within each of the complementary cells that are to be set to the high logic level is higher than such complementary set verify reference current, for instance, Icell>8 $\mu$A;

a direct cell reset verify subphase, wherein each current flowing in a direct cell that is to be set to a low logic level is compared with a direct reset verify reference current, for instance, with a value of about 4 $\mu$A, to check if each of the direct cells that are to be set to the low logic level is correctly set to such logic level, that is, to check if the current flowing within each of the direct cells that are to be set to the low logic level is lower than such direct reset verify reference current, for instance, Icell<4 $\mu$A; and a complementary cell reset verify subphase, wherein each current flowing in a complementary cell that is to be set to a low logic level is compared with a complementary reset verify reference current, for instance, of a value equal to the direct reset verify reference current, that is, about 4 µA, to check if each of the complementary cells that are to be set to the low logic level is correctly set to such logic level, that is, to check if the current flowing within each of the complementary cells that are to be set to the low logic level is lower than such complementary reset verify reference current, for instance, Icell<4 µA.

To summarize, each of such verify subphases is performed using a set of parameters (for instance, selected according to the currently performed verify subphase) that comprises: a reference current for comparison with a current flowing through the cell subjected to write verify operation; and a direction of inequality applied in such comparison.

Therefore, the verify phase may comprise: first write verify operations, for instance, the write verify operations performed in the direct cell set verify subphase and in the complementary cell set verify subphase, performed on first cells, for instance, direct and complementary cells that are to be set to a high logic level, in such plurality of cells using a first reference current, for instance, the direct set verify reference current or the complementary set verify reference current, with a first direction of inequality by checking if such current flowing through the cell subjected to first write verify operation is higher than such first reference current, wherein the actual logic level stored in the first cells in such plurality of cells is held to match such binary logic level, that is, a high logic level, in response to the current flowing through the cell subjected to first write verify operation being higher than the first reference current.

The verify phase may comprise, additionally or alternatively to the first write verify operations: second write verify operations, for instance, the write verify operations performed in the direct cell reset verify subphase and in the complementary cell reset verify subphase, performed on second cells, for instance, direct and complementary cells that are to be set to a low logic level, in such plurality of cells using a second reference current, for instance, the direct reset verify reference current or the complementary reset verify reference current, with a second direction of inequality by checking if such current flowing through the cell subjected to second write verify operation is lower than such second reference current, wherein the actual logic level stored in the second cells in such plurality of cells is held to match such binary logic level, that is, a low logic level, in response to the current flowing through the cell subjected to second write verify operation being lower than the second reference current.

In various embodiments, such first reference current is higher than such second reference current.

Figure 2B:
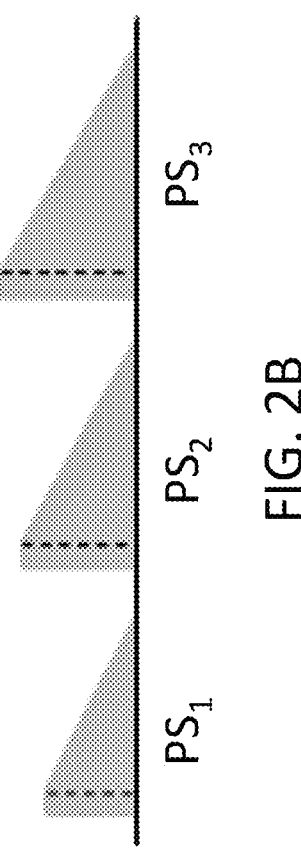
FIG. 2A and FIG. 2B illustrate subsequent reset and set current pulses, respectively.
Figure 2A:

The set and reset pulse phase may comprise one or more of the following subphases:

a direct cell set pulse subphase, wherein a set pulse of triangular shape, for instance, $PS_1$, $PS_2$, or $PS_3$ of FIG. 2B, is applied to each of the direct cells that are to be set to a high logic level and that fail the corresponding direct cells set verify subphase;

a complementary cell set pulse subphase, wherein a set pulse of triangular shape, for instance, $PS_1$, $PS_2$, or $PS_3$ of FIG. 2B, is applied to each of the complementary cells that are to be set to a high logic level and that fail the corresponding complementary cells set verify subphase;

a direct cell reset pulse subphase, wherein a reset pulse of rectangular shape, for instance, $PR_1$, $PR_2$, or $PR_3$ of FIG. 2A, is applied to each of the direct cells that are to be set to a low logic level and that fail the corresponding direct cells reset verify subphase; and a complementary cell reset pulse subphase, wherein a reset pulse of rectangular shape, for instance, $PR_1$, $PR_2$, or $PR_3$ of FIG. 2A, is applied to each of the complementary cells that are to be set to a low logic level and that fail the corresponding complementary cells reset verify subphase.

FIG. 2A and FIG. 2B illustrate subsequent reset $PR_1$, $PR_2$, and $PR_3$, collectively referred to with the reference PR, and set $PS_1$, $PS_2$, and $PS_3$, collectively referred to with the reference PS, current pulses, respectively.

FIG. 2A illustrates a sequence of reset current pulses PR that are used for reset write operations, including at least:

a first reset pulse $PR_1$, for instance, with a rectangular shape, for instance, with a value that is about 240 µA and that lasts for about 0.1 µs, which is used in a first reset pulse subphase if a previous first reset verify subphase failed, a second reset pulse $PR_2$, for instance, with a rectangular shape, for instance, with a value that is about 270 µA and that lasts for about 0.1 µs, which is used in a second reset pulse subphase if a previous second reset verify subphase failed, that is, if the first reset pulse subphase is considered as failed; and a third reset pulse $PR_3$, for instance, with a rectangular shape, for instance, with a value that is about 300 µA and that lasts for about 0.1 µs, which is used in a third reset pulse subphase if a previous third reset verify subphase failed, that is, if the second reset pulse subphase is considered as failed.

FIG. 2B illustrates a sequence of set current pulses PS that are used for set write operations, including at least:

a first set pulse $PS_1$, for instance, comprising a first rectangular shape, for instance, with a maximum value that is about 160 µA which lasts for about 0.2 µs, and a second triangular shape, for instance, decreasing from the maximum value with a slope of about 0.045 µA/ns and that lasts for about 3.5 µs, as illustrated in FIG. 2B, which is used in a first set pulse subphase if a previous first set verify subphase failed;

a second set pulse $PS_2$, for instance, comprising a first rectangular shape, for instance, with a maximum value that is about 230 µA which lasts for about 0.2 µs, and a second triangular shape, for instance, decreasing from the maximum value with a slope of about 0.045 µA/ns and that lasts for about 5 µs, as illustrated in FIG. 2B, which is used in a second set pulse subphase if a previous second set verify subphase failed, that is, if the first set pulse subphase is considered as failed; and a third set pulse $PS_3$, for instance, comprising a first rectangular shape, for instance, with a maximum value that is about 260 µA which lasts for about 0.2 µs, and a second triangular shape, for instance, decreasing from the maximum value with a slope of about 0.045 µA/ns and that lasts for about 5.7 µs, as illustrated in FIG. 2B, which is used in a third set pulse subphase if a previous third set verify subphase failed, that is, if the second set pulse subphase is considered as failed.

Therefore, write operations, for instance, either set write operations or reset write operations, performed after a previously failed write operation, for instance, either a failed set write operation or a failed reset write operations respectively, are performed with current pulses, for instance, set PS or reset PR current pulses respectively, of increased value in order to decrease the probability of a further failed write operation.

It is noted that the reset/set current pulses illustrated in FIGS. 2A and 2B are shown by way of example only, thus: a smaller number of current pulses may be considered, for instance, a single or a pair of current pulses, or a higher number of current pulses, for instance, an additional current pulse may be used, for instance, to perform a fourth reset/set pulse subphase if a previous fourth reset/set verify subphase failed, that is, if the third reset/set pulse subphase is considered as failed; different current (μA) and time (μs) values may be considered for each of the reset/set current pulses; and/or different shapes may be considered for each of the reset/set current pulses.

During a verify phase of a write operation, a sense amplifier compares a current flowing within a cell with a fixed reference current whose value depends on a currently performed subphase of such verify phase, that is, direct set verify reference current, complementary set verify reference current, direct reset verify reference current, or complementary reset verify reference current.

During any of the subphases of a verify phase, the side of the sense amplifier receiving the fixed reference current is coupled to a main bit line MBL and to a local bit line BL which is placed in a PCM sector that is symmetric with respect to an addressed one, the one comprising a cell that is currently considered for the verify phase of the write operation. In such a way, a load capacitance is balanced.

In addition, during a verify phase of a write operation: both a direct cell and a respective complementary cell are pre-charged before a sensing phase; and only one of the direct cell and the respective complementary cell is coupled with a terminal of the sense amplifier.

It is noted that write operations as described in the following and executed in a PCM device are performed under the control of control unit CU that may be programmed to implement the methods 20, 30 described herein.

Figure 3:
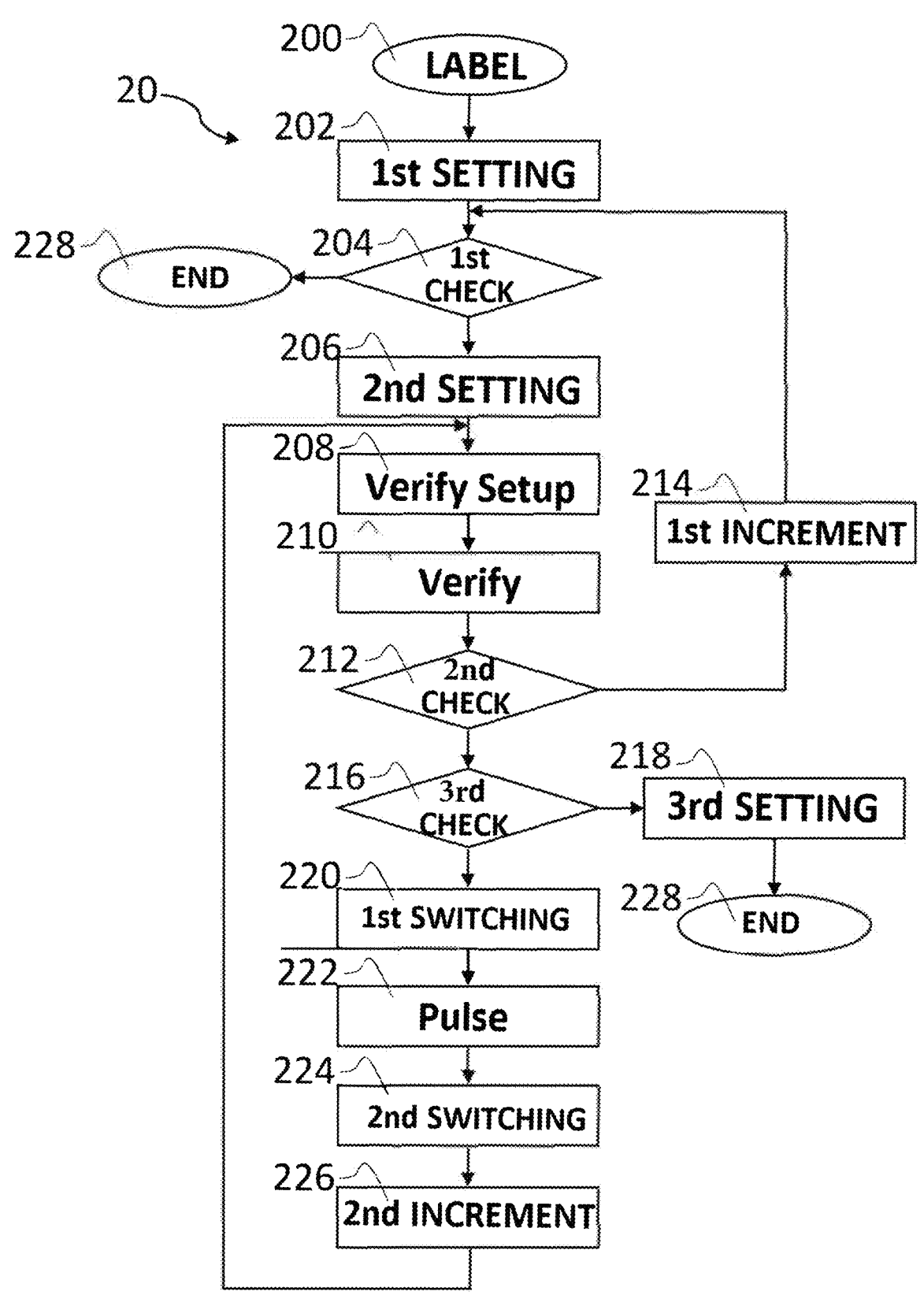
FIG. 3 is a flow diagram of a method for performing write operations including write verify operations.

FIG. 3 is a flow diagram of a method 20 for performing write operations including write verify operations.

To perform such method 20 the cells of a PCM memory may be divided in a plurality of groups ("sets"), comprising at least four different groups: a first group, comprising direct cells that are to be set to a high logic level through a set write operation; a second group, comprising complementary cells that are to be set to a high logic level through a set write operation; a third group, comprising direct cells that are to be set to a low logic level through a reset write operation; and a fourth group, comprising complementary cells that are to be set to a low logic level through a reset write operation.

In such a method 20, each of these groups is managed sequentially with respect to the other groups, for instance, performing at first write operations and write verify operations on the first group, then, in sequence, on the second group, the third group and, the fourth group.

To summarize, the plurality of sets (groups) of cells comprises: direct cells, each configured to have written therein a direct bit value equal to one of such high logic level and low logic level; and complementary cells, each cell in the set of complementary cells being coupled to a respective cell in the set of direct cells and being configured to have written therein a complementary bit value equal to the other of such high logic level and low logic level.

Such direct and complementary cells are arranged in: a first set (first group) comprising direct cells configured to have written therein a direct bit value equal to such high logic level; a second set (second group) comprising complementary cells configured to have written therein a complementary bit value equal to a high logic level; a third set (third group) comprising direct cells configured to have written therein a direct bit value equal to such low logic level; and a fourth set (fourth group) comprising complementary cells configured to have written therein a complementary bit value equal to a low logic level.

Thus, such verify phase comprises: performing such first write verify operations on such first set of direct cells and such second set of complementary cells; and performing such second write verify operations on such third set of direct cells and such fourth set of complementary cells.

Such set and reset pulse phase, that is, correcting the actual logic level of at least one cell to match the binary logic level of such at least one cell, that is, the logic level to which such at least one cell is to be set with a corresponding write operation, comprises: set write operations 3161 performed on cells comprised in such first set and such second set; and reset write operations 3162 performed on cells comprised in such third set and such fourth set.

The method 20 starts in a step 200 which is configured, for instance, to label each of the groups as still not considered, and then such method 20 proceeds to a first setting step 202.

It is noted that such labeling may be done in any possible way, for instance, by associating a binary flag to the groups, such flag being indicative of the state of a group, that is, considered/not considered, or by associating each group to a number, for instance, associating the first group to the number one ("1"), the second group to the number two ("2"), etc., and by storing in a variable a group counter value indicating which is the first group that has not been considered yet, that is, the currently selected group, for instance, if such group counter value is equal to two, the first group has already been considered, the second, third, and fourth groups are still to be considered, and the second group is considered as the currently selected group.

Such first setting step 202 is configured to select a group in the plurality of groups previously described, for instance, to select the first group from the plurality of groups.

For example, if each of the groups is associated to a number, the group associated to the smaller of the numbers may be selected, for instance, the first group associated to the number one.

Alternatively, if each of the groups is associated to a corresponding flag, a random group in the plurality of groups may be selected or the first group may always be selected first.

A first checking step 204 is configured to check if each of the groups in the plurality of groups has already been considered.

For example, if each of the groups is associated to a number, for instance, the first, second, third, and fourth group are respectively associated to the number one, two, three, and four, the first checking step 204 may be configured to check if the variable containing the group counter value is higher than four and, if such a condition is satisfied, the first checking step 204 is configured to determine that each of the groups in the plurality of groups has already been considered.

Alternatively, if each of the groups is associated to a corresponding flag, the first checking step 204 may be configured to check if the value of each of the flags corresponds to a value indicating that the corresponding group has already been considered and, if such a condition is satisfied, the first checking step 204 is configured to determine that each of the groups in the plurality of groups has already been considered.

If each of the groups in the plurality of groups has already been considered, the method 20 proceeds to an ending step 228 that is configured to end the corresponding method 20.

Otherwise, if there are still groups to be considered, for instance, if a currently selected group is still to be considered, the method 20 proceeds to a second setting step 206, such second setting step 206 being configured to: if the operation to be performed is a set write operation, select the first set pulse $PS_1$ as the current pulse for performing a subsequent set pulse phase (that is, the currently selected current pulse); and if the operation to be performed is a reset write operation, select the first reset pulse $PR_1$ as the current pulse for performing a reset pulse phase (that is, the currently selected current pulse).

It is noted that the operation to be performed depends on the subphase of the pulse phase that is to be performed, that is, on the currently selected group in the plurality of groups.

In fact, if the currently selected group is the first, second, third, or fourth group, the corresponding selected subphase of the pulse phase that is to be performed is the direct cells set pulse subphase, complementary cells set pulse subphase, direct cells reset pulse subphase, or complementary cells reset pulse subphase, respectively.

Such second setting step 206 is further configured to label each of the reset/set current pulses PR and PS as still not used.

It is noted that what has been previously described for the labeling of the groups is valid even for the pulses labeling operation, therefore, such pulse labeling may be done in any possible way, for instance, by associating a binary flag to the pulses, such flag being indicative of the state of a pulse, that is, considered/not considered, or by associating each pulse to a number, for instance, associating the first set pulse $PS_1$ and the first reset pulse $PR_1$ to the number one ("1"), the second set pulse $PS_2$ and the second reset pulse $PR_2$ to the number two ("2"), etc., and by storing in a variable a pulse counter value indicating which is the first pulse that has not been considered yet, that is, the currently selected current pulse, for instance, if such pulse counter value is equal to three and if a set write operation is being performed, the first set pulse $PS_1$ and the second set pulse $PS_2$ have already been considered while the third set pulse $PS_3$ is still to be considered and is considered as the currently selected pulse.

After the selection of a current pulse to be used in a corresponding reset or set pulse phase, the method 20 proceeds to a verify setup step 208, such verify setup step 208 being configured to prepare the PCM for performing a write verify operation, for instance, by selecting the correct fixed reference current whose value depends on the subphase of the verify phase that is to be performed, that is, on the currently selected group in the plurality of groups.

In fact, if the currently selected group is the first, second, third, or fourth group, the corresponding selected subphase of the verify phase that is to be performed is the direct cells set verify subphase, complementary cells set verify subphase, direct cells reset verify subphase, or complementary cells reset verify subphase, respectively.

Then, a verify step 210 is configured to perform the operations of the subphase, that is, chosen according to the currently selected group, that is to be performed on each of the cells comprised in the currently selected group.

Such performing operation comprises comparing for each of the cells comprised in the currently selected group a current flowing in the considered cell with the fixed reference current selected in the verify setup step 208, and to check if such current flowing in the considered cell is higher or lower than such fixed reference current.

The verify step 210 is further configured to provide to a second checking step 212 a result for each of the cells comprised in the selected group, such result being indicative of the outcome of the verify subphase performed, for instance, a value indicating a successful or failed operation, that is, indicating if a currently considered cell comprised in such currently selected group is correctly set to a desired logic level or not.

The condition to determine a successful or failed operation in order to set the value of a corresponding result depends on the currently selected group, therefore, if the currently selected group is the first or second group, a successful condition is determined if the result of the checking operation determines that such current flowing in the considered cell is higher than such fixed reference current, otherwise, if the currently selected group is the third or fourth group, a successful condition is determined if the result of the checking operation determines that such current flowing in the considered cell is lower than such fixed reference current.

The second checking step 212 is configured to receive such results of the execution of the verify subphase on each of the cells comprised in the currently selected group from the verify step 210 and to check if any of such results indicates that a cell in such cells comprised in the currently selected group is not correctly set to the desired value, that is, if at least a result indicates an unsuccessful operation.

If each of the cells comprised in the selected group is correctly set to the desired value, the method 20 proceeds to a first incrementing step 214, such incrementing step 214 being configured to label the currently selected group as already been used and to select a different group in the plurality of groups, prioritizing those groups that have not been considered yet, for instance, by selecting a next group in a sequence of groups.

For example, if each of the groups is associated to a number, the first incrementing step 214 is configured to increment the group counter value in order to change the labeling of the currently selected group in already been used and selecting the group corresponding to the incremented value of the group counter value as new currently selected group.

Alternatively, if each of the groups is associated to a corresponding flag, the first incrementing step 214 is configured to change the flag value of the currently selected group to indicate that such group has already been considered, and to select, for instance, randomly or following a predetermined order, a different group in the plurality of groups that has not been considered yet as new currently selected group.

After such first incrementing step 214, the method 20 returns from the first incrementing step 214 to the first checking step 204.

If one or more cells comprised in the selected group are not correctly set to the desired value, the method 20 proceeds to a third checking step 216.

The third checking step 216 is configured to check if the currently selected current pulse for performing a set or reset pulse phase, that is, selected in the second setting step 206 or in a second incrementing step 226, is comprised in a set of available current pulses, for instance, the set of current pulses shown in FIGS. 2A and 2B, and is labeled as still not used, that is, such third checking step 216 checks if there is still any current pulse left to be used.

For example, if each of the current pulses is associated to a number, the third checking step 216 may be configured to check if the variable containing the pulse counter value is higher than three (the number of considered current pulses in the embodiments of FIGS. 2A and 2B) and, if such a condition is satisfied, the third checking step 216 is configured to determine that each of the current pulses has already been considered.

Alternatively, if each of the pulses is associated to a corresponding flag, the third checking step 216 may be configured to check if the value of each of the flags corresponds to a value indicating that the corresponding pulse has already been considered and, if such a condition is satisfied, the third checking step 216 is configured to determine that each of the pulses has already been considered.

If the currently selected current pulse has already been used, that is, if each of the current pulses has already been used, the method 20 proceeds to a third setting step 218 that is configured to indicate the failure of the write operation, for instance, by setting the value of a failure variable to a high logic level and, optionally, sending such failure variable to an internal and/or external control unit, for instance, to any type of elaboration unit as a processor, a microprocessor, a microcontroller, a logic unit, or the like, even distributed, for instance, the control unit CU of the PCM.

After rising the failure of the write operation through such third setting step 218, the method 20 proceeds to the ending step 228 that is configured to end the method 20.

Otherwise, if at least the currently selected current pulse is still to be used, the method 20 proceeds to a first switching step 220, such first switching step 220 being configured to modify a configuration and/or configuration parameters of the PCM in order to switch from a write verify operation to a write operation.

A pulse step 222 is then configured to generate a current pulse with the features of the currently selected current pulse, for instance, the current pulse selected in second setting step 206 or a current pulse selected in a second incrementing step 226, and to apply such generated current pulse to each of the cells comprised in the currently selected group that are not correctly set to the desired value.

A second switching step 224 is configured to modify the configuration and/or configuration parameters of the PCM in order to switch from a write operation to a write verify operation, and then the method 20 proceeds to the second incrementing step 226.

The second incrementing step 226 is configured to label the currently selected current pulse as already been used and to select the next current pulse in a sequence of current pulses, for instance, the sequence of set current pulses PS (FIG. 2B) or the sequence of reset current pulses PR (FIG. 2A), if such next current pulse is labeled as still not used.

For example, if each of the current pulses is associated to a number, the second incrementing step 226 is configured to increment the pulse counter value in order to change the labeling of the currently selected current pulse which has already been used and selecting the current pulse corresponding to the incremented value of the pulse counter value as new currently selected current pulse.

Alternatively, if each of the pulses is associated to a corresponding flag, the second incrementing step 226 is configured to change the flag value of the currently selected current pulse to indicate that such current pulse has already been considered, and to select, for instance, following a predetermined order, a different current pulse that has not been considered yet as new currently selected current pulse.

For instance, if each of the pulses is associated to a corresponding flag, an example of a predetermined order to choose the next current pulse to be considered as new currently selected current pulse may be:

if the operation to be performed is a set write operation, the order of the current pulses selected as currently selected current pulse is (from the first to the last): the first set pulse $PS_1$, the second set pulse $PS_2$, and the third set pulse $PS_3$;

if the operation to be performed is a reset write operation, the order of the current pulses selected as currently selected current pulse is (from the first to the last): the first reset pulse $PR_1$, the second reset pulse $PR_2$, and the third reset pulse $PR_3$; and if each of the current pulses within such sequence of current pulses is labeled as already been used any selection may be possible (even not selecting a next current pulse) as the method 20 ends with a failure once the third checking step 216 is reached again, before performing a further pulse step 222.

After such second incrementing step 226, the method 20 is configured to return to the verify setup step 208.

The method 20 of FIG. 3 facilitates performing write operations including write verify operations but:

each of the write verify operations may be affected by a different word line IR drop, such word line IR drop being dependent on the pattern of the considered cells in a corresponding tile during each of such write verify operations, that is, such word line IR drop may depend on the sequence of logic levels of the considered cells in a corresponding tile during each of such write verify operations; and the method 20 is relatively slow and not optimized for fast write verify operations, resulting in less reactive PCM devices and reducing the performance of systems containing such PCM devices.

The word line IR drop during write verify operations may be caused by an asymmetry between the number of cells that are set to a high logic level and the number of cells that are set to a low logic level within a corresponding tile, such asymmetry being caused by cells in such tile that are not set to the correct desired logic level, for instance, cells that are set to a low logic level instead of a high logic level, increasing the number of cells that are currently set to one of the logic levels within such tile, for instance, increasing the number of cells that are set to the low logic level in such tile.

Therefore, during write verify operations, the number of cells in a given tile storing high logic levels may be different from the number N and, consequently, the number of cells in the same given tile storing low logic levels may be different from the number N, with such number N being the number of sense amplifier in such given tile.

It is noted that such asymmetry may not be present during the first verify operation and/or the last verify operation performed over a given tile, as the cells of such tile are supposed to be in a correct logic level (that is, obtained as a result of successful write operations and thus balanced), that is, the number of cells in such tile storing high logic levels is supposed to be equal to the number of cells in such tile storing low logic levels and both are supposed to be equal to the number N indicating the number of sense amplifier in such tile.

As noted, the method 20 is relatively slow and not optimized for fast write verify operations, in so far as: direct and complementary cells pulse phases are managed separately; and for each group in the plurality of groups, the first switching step 220 is required each time the method 20 switches from a write verify operation to a write operation and the second switching step 224 is required each time the method 20 switches from a write operation to a write verify operation.

The first switching step 220 and the second switching step 224 involve both time and additional consumption, that is, an additional current consumption, that may be due to the presence of charging and discharging elements used to perform such steps.

Figure 4:
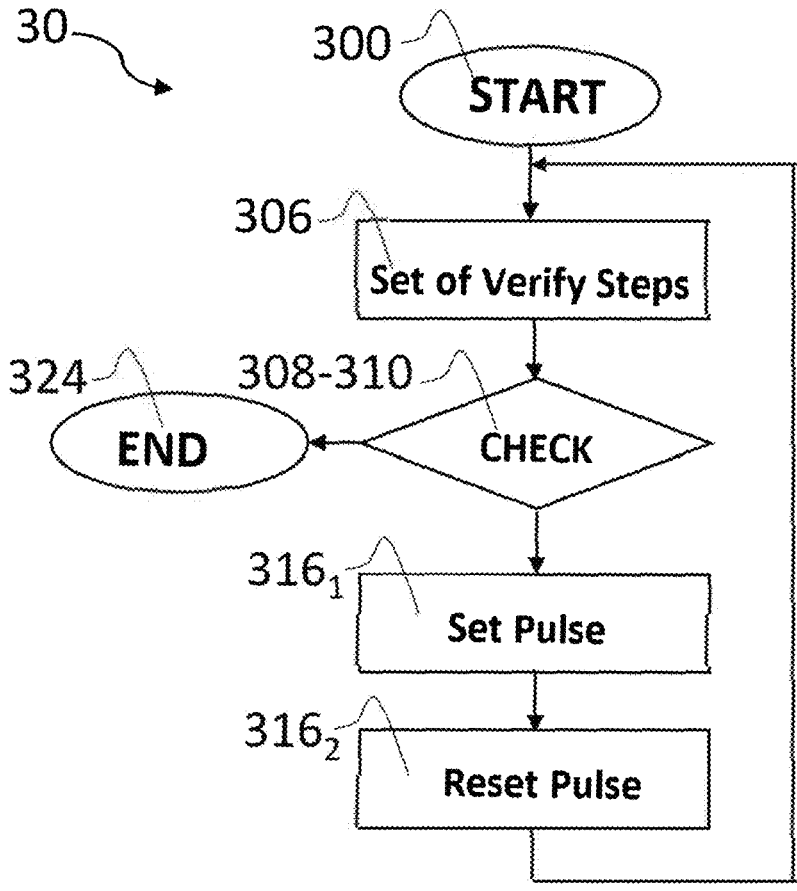
FIG. 4 and FIG. 5 are flow diagrams of a method for performing write operations including write verify operations, according to embodiments of the present description.
Figure 5:
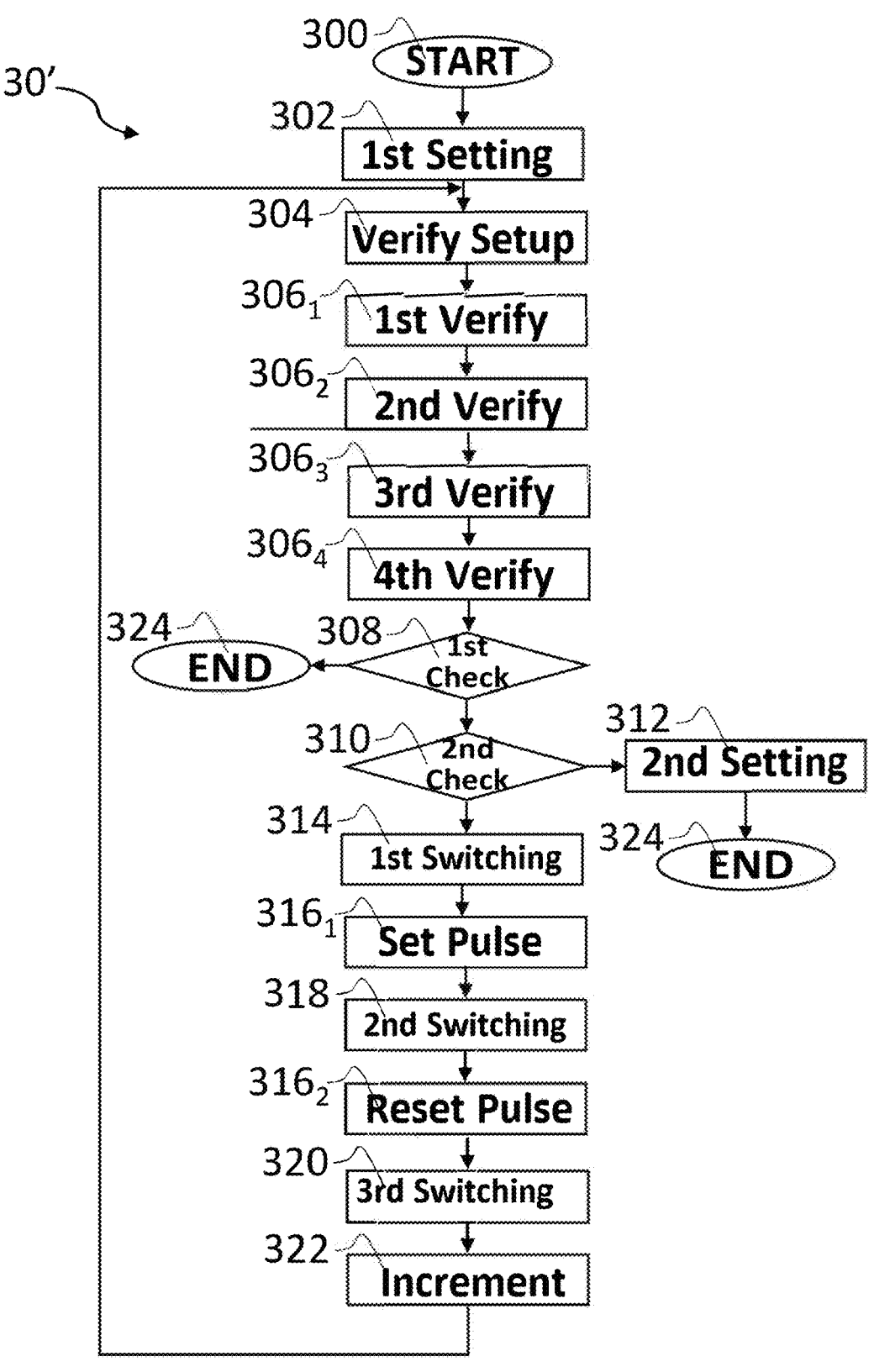

FIG. 4 and FIG. 5 are flow diagrams of a method 30, 30' for performing write operations including write verify operations, according to solutions disclosed herein.

To further improve the performance of such methods, instead of injecting into the word line $WL_j$ only the currents of the verified cells, and therefore, instead of coupling only the cells to be verified to the word line $WL_j$, both the direct cell and the respective complementary cell are coupled to a selected word line, for instance, the word line $WL_j$, thus, they both contribute to the word line IR drop as in a differential read operation. In such a way, injecting into the word line $WL_j$ both the currents of the direct cell and the respective complementary cell, the word line $WL_j$ IR drop is maintained stable.

Such methods 30, 30' illustrated in FIGS. 4 and 5 may be used to reduce the impacts of the problems illustrated for the method 20 described above.

The methods 30, 30' are based on performing sets of write verify operations containing, for instance, a subset of write verify operations related to the first group, a subset related to the second group, a subset related to the third group, and a subset related to the fourth group, without pulse phases in the middle.

Such subsets of write verify operations are considered sequentially, for instance, performing in sequence the write verify operations of the subset related to the first group, those of the subset related to the second group, those of the subset related to the third group, and those of the subset related to the fourth group.

It is noted that also other sequences may be considered, for instance, a sequence determined by ordering the subsets randomly.

In this way, a first set of write verify operations, that is, containing the write verify operations that are performed before any pulse phase, may be performed without any asymmetry between the number of cells of a corresponding tile that are set to a high logic level and the number of cells in the same tile that are set to a low logic level since such write verify operations are performed before any pulse phase, that is, when the cells of such tile are supposed to be in a correct logic level since they were obtained as a result of successful write operations.

Therefore, if the number of sense amplifiers for such tile is equal to the number N, the number of cells storing high logic levels in the same tile is equal to the number N and even the number of cells storing low logic levels in the same tile is equal to the number N, that is, to the number of cells storing high logic levels.

In addition, the methods 30, 30' are based on performing sets of write operations, for instance, a first set of write operations containing a subset of write operations related to the first group and a subset related to the second group, and a second set of write operations containing a subset of write operations related to the third group and a subset related to the fourth group, wherein such first set of write operations and such second set of write operations are performed without verify phases in the middle.

These sets and subsets of write operations are considered sequentially, for instance, performing in sequence the write operations of the first set, that is, performing in sequence the write operations of the subset related to the first group and those of the subset related to the second group, and the write operations of the second set, that is, performing in sequence the write operations of the subset related to the third group and those of the subset related to the fourth group.

Also in this case, it is noted that also other sequences may be considered, for instance, a sequence determined by ordering the sets and the subsets randomly.

Therefore, as a second set of write verify operations is performed after a first and a second set of write operations, and considering that only about 3% of the cells within a tile require a second set pulse and less than about 1% of the cells of the tile require a second reset pulse, if the number of sense amplifier for a given tile is equal to the number N, the number of cells in the same tile storing high logic levels is about the number N and even the number of cells in the same tile storing low logic levels is about the number N.

Thus, even for the second set of write verify operations the effects of the asymmetries may be considered to be almost negligible, and, considering that an even smaller percentage of cells require a third pulse or further pulses, asymmetries effects may be considered to be almost negligible even for set of write verify operations considered after the second one.

Generally, word line IR drops resulting from such asymmetries may be considered about constant during each of the write verify operations performed by the methods 30, 30'.

Such a conclusion is generally valid when such methods 30, 30' are used since the first set of write operations, and generally every set of write operations, comprises performing write operations on each of the cells of each of the groups in the plurality of groups, therefore, every cell of a corresponding tile whose logic level is to be modified during the current write operation has received at least one current pulse, that is, only a negligible number of such cells is still in a wrong logic level (refer to the percentages above), maintaining a balance of the cells set to one logic level and the cells set to the other logic level.

It is noted that a similar conclusion may not hold for method 20 since by performing write operations on each of the cells of a single group, that is, during the pulse step 222, before the next write verify operation, that is, before the next verify step 210, a portion of the cells in a corresponding tile whose logic level is to be modified during the current write operation is still set according to a previous write operation, that is, has not yet received a current pulse, while another portion of the cells of the same tile whose logic level is to be modified during the current write operation is set according to such current write operation, that is, has already received a current pulse and may be waiting for a second pulse, causing an unbalancing between cells set to a logic level and cells set to the other logic level.

The methods 30, 30' are further based on merging the direct cells set pulse subphase with the complementary cells set pulse subphase.

Such merging may be done in two-cells-per-bit PCMs as each sense amplifier in a tile has coupled to only one of its two terminal a cell that is to be set to a high logic level, thus, allowing the set pulse subphases of both direct and complementary cells to be simultaneous.

Therefore, the direct cells coupled to some of the sense amplifiers are pulsed together with the complementary cells coupled to some others of the sense amplifiers using respective set pulses.

Such merging of the direct cells set pulse subphase and the complementary cells set pulse subphase is possible since the write verify operations of the verify phase have been already performed for each of the groups in the plurality of groups prior any of such pulse phases.

Similarly, the methods 30, 30' are further based on merging the direct cells reset pulse subphase with the complementary cells reset pulse subphase.

Even in this case, such merging may be done in two-cells-per-bit PCMs as each sense amplifier in a tile has coupled to only one of its two terminal a cell that is to be set to a low logic level, thus, allowing the reset pulse subphases of both direct and complementary cells to be simultaneous.

Therefore, the direct cells coupled to some of the sense amplifiers are pulsed together with the complementary cells coupled to some others of the sense amplifiers using respective reset pulses.

Even in this case, it is to be noted that such merging of the direct cells reset pulse subphase and the complementary cells reset pulse subphase is possible since the write verify operations of the verify phase have been already performed for each of the groups in the plurality of groups prior any of such pulse phases.

As a result of one or more of the previously described changes, that is, one or more between: performing sets of write verify operations without pulse phases in the middle; merging the direct cells set pulse subphase and the complementary cells set pulse subphase; and merging the direct cells reset pulse subphase and the complementary cells reset pulse subphase; wherein the number of times the performing of the first switching step 220 and second switching step 224 is required may be relevantly reduced.

For instance, in embodiments as that illustrated in FIG. 4 or FIG. 5, the number of times the performing of the first switching step 220 and second switching step 224 is required is equal to the number of available current pulses, for instance, to the number of current pulses in the set of current pulses illustrated in FIG. 2A or 2B.

For example, if the current pulses used in an embodiment of the methods 30, 30' are that illustrated in FIG. 2A and FIG. 2B, the first switching step 220 and second switching step 224 are required only three times at most for each write operation.

The reduction of the number of times the performing of such first switching step 220 and such second switching step 224 is required may further reduce: the time needed for performing a write operation, as the time needed for such switching operations is reduced; and the consumption of the corresponding PCM device and/or related devices.

In addition, the time needed for performing a write operation may be even further reduced through the parallelization, that is, the merging, of: the set write operation for direct and complementary cells, and/or the reset write operation for direct and complementary cells.

Therefore, the methods 30, 30', for instance, the methods illustrated in FIG. 4 or FIG. 5, may mitigate the effects of the problems previously described that affect the method 20 illustrated in FIG. 3.

The method 30 illustrated in FIG. 4 comprises at least the following steps:

a set of verify steps 306, configured to perform a write verify operation on each of the cells of each of the groups in the plurality of groups, that is, according to the considered group in the plurality of groups a given subphase of the verify phase is performed on each of the cells comprised in the considered group;

a checking step 308-310, configured to check if further write operations, that is, further pulse phases, are needed, for instance, by determining if any of the cells of any group in the plurality of groups is not correctly set to the desired value, that is, if one or more of the write verify operations fails, and by checking if there is still any current pulse left to be used, for instance, by checking if a selected current pulse for performing a set or reset pulse phase is comprised in a set of available current pulses, for instance, the set of current pulses shown in FIGS. 2A and 2B, and is labeled as still not used;

a set pulse step 3161, configured to perform a set write operation, that is, to generate a set current pulse and to apply such generated set current pulse to each of the cells that are not correctly set to a high logic level, irrespective of their group; and a reset pulse step 3162, configured to perform a reset write operation, that is, to generate a reset current pulse and to apply such generated reset current pulse to each of the cells that are not correctly set to a low logic level, irrespective of their group.

Wherein such set pulse step 3161 and such reset pulse step 3162 are performed only if such checking step 308-310 determines that one or more cells of any group in the plurality of groups are not correctly set to the desired logic level.

In various embodiments, if there is at least one cell that is not correctly set to a high logic level but each of the cells that should be set to a low logic level are correctly set, the method 30 may be configured to perform a set pulse step 3161 but not a reset pulse step 3162.

In various embodiments, if there is at least one cell that is not correctly set to a low logic level but each of the cells that should be set to a high logic level are correctly set, the method 30 may be configured to perform a reset pulse step 3162 but not a set pulse step 3161.

To summarize, the method 30 may be used to perform write operations in a Phase Change Memory (PCM) device, the PCM device comprising a plurality of sets (groups) of cells, for instance, the first, second, third and fourth groups described, configured to have written therein, in response to a write operation, a binary logic level selected from a high logic level and a low logic level, wherein each cell is included in a respective set of cells in the plurality of sets of cells;

wherein the method 30 comprises:

performing, on the cells in such plurality of sets of cells, write verify operations 306 configured to provide results indicative of an actual logic level stored in the cells in such plurality of sets wherein the write verify operations are performed on each cell with a set of parameters, for instance, a given reference current and a direction of an inequality, selected as a function of the respective set of cells including the cell;

checking 308-310, based on the results from such write verify operations, if the actual logic level stored in the cells in such plurality of sets matches such binary logic level;

in response to such checking 308-310 determining that in at least one cell in such plurality of sets the actual logic level fails to match such binary logic level, correcting such actual logic level to match such binary logic level via:

a set write operation 3161 in case the binary logic level is a high logic level; and a reset write operation 3162 in case the binary logic level is a low logic level.

Thus, the method 30 may further comprise, in response to a failed set write operation 3161 and/or a failed reset write operation 3162, repeating such set write operations 3161 and/or such reset write operations 3162 with set PS or reset PR current pulses, respectively, of increased value, (as described for FIG. 2A and FIG. 2B).

In various embodiments the method 30 illustrated in FIG. 4 may comprise additional steps, for instance, the steps of the method 30' illustrated in FIG. 5, a subset of such steps (for instance, by excluding the second setting step 312), or even additional steps besides those shown in FIG. 5.

Therefore, the following description of the steps of the method 30' of FIG. 5 is reported herein by way of example only, that is, to show an example of a possible way to add steps to such method 30 of FIG. 4.

It is noted that the method 30 may also include only the steps previously described (that is, 306, 308-310, 3161, 3162), as illustrated in FIG. 4, or, in various embodiments, for instance, as illustrated in FIG. 5, such method 30 may even include additional steps as previously described.

The method 30' starts in a step 300 and proceeds to a first setting step 302.

Such first setting step 302 is configured to select the first set pulse $PS_1$ as the set current pulse for performing a subsequent set pulse phase and the first reset pulse $PR_1$ as the reset current pulse for performing a reset pulse phase.

In addition, such first setting step 302 is further configured to label each of the reset/set current pulses PR and PS as still not used.

Such pulse labeling may be done in any possible way, for instance, by associating a binary flag to the pulses, such flag being indicative of the state of a pulse, that is, considered/not considered, or by associating each pulse to a number, for instance, associating the first set pulse $PS_1$ and the first reset pulse $PR_1$ to the number one ("1"), the second set pulse $PS_2$ and the second reset pulse $PR_2$ to the number two ("2"), etc., and by storing in a variable a pulse counter value indicating which is the first pulse that has not been considered yet, that is, the currently selected current pulse, for instance, if such pulse counter value is equal to three and if a set write operation is being performed, the first set pulse $PS_1$ and the second set pulse $PS_2$ have already been considered while the third set pulse $PS_3$ is still to be considered and is considered as the currently selected pulse.

A verify setup step 304 is configured to prepare the PCM for performing a plurality of write verify operations, for instance, by selecting a fixed reference current for each subphase of the verify phase that is to be performed.

After the verify setup step 304, the set of verify steps 306 is performed, such set of verify steps 306 being configured to perform a set of write verify operations for each of the groups in the plurality of groups.

Each of such set of write verify operations comprises comparing, for each of the cells comprised in the group associated with the currently considered set of write verify operations, a current flowing in the considered cell with the fixed reference current selected in the verify setup step 304, and to check if such current flowing in the considered cell is higher or lower than such fixed reference current.

For instance, the set of verify steps 306 may comprise the following stages:

a first verify stage 3061, configured to implement a direct cell set verify operation in order to perform a write verify operation of each of the cells comprised in the first group, that is, the group comprising direct cells that are to be set to a high logic level through a set write operation, for instance, by comparing a current flowing in each of such cells with a direct set verify reference current as described before;

a second verify stage 3062, configured to implement a complementary cell set verify operation in order to perform a write verify operation of each of the cells comprised in the second group, that is, the group comprising complementary cells that are to be set to a high logic level through a set write operation, for instance, by comparing a current flowing in each of such cells with a complementary set verify reference current as described before;

a third verify stage 3063, configured to implement a direct cell reset verify operation in order to perform a write verify operation of each of the cells comprised in the third group, that is, the group comprising direct cells that are to be set to a low logic level through a reset write operation, for instance, by comparing a current flowing in each of such cells with a direct reset verify reference current as described before; and a fourth verify stage 3064, configured to implement a complementary cell reset verify operation in order to perform a write verify operation of each of the cells comprised in the fourth group, that is, the group comprising complementary cells that are to be set to a low logic level through a reset write operation, for instance, by comparing a current flowing in each of such cells with a complementary reset verify reference current as described before.

In addition, each of such stages 306 is further configured to provide to the checking step 308-310 a result for each of the cells comprised in the respective group associated to such considered stage, such result being indicative of the outcome of the verify subphase performed, for instance, a value indicating a successful or failed operation, that is, indicating if a currently considered cell comprised in such respective group is correctly set to a desired logic level or not.

The condition to determine a successful or failed operation in order to set the value of a corresponding result depends on the respective group considered, therefore, if the respective group considered is the first or second group, a successful condition is determined if the result of the checking operation determines that such current flowing in the considered cell is higher than such fixed reference current, otherwise, if the respective group considered is the third or fourth group, a successful condition is determined if the result of the checking operation determines that such current flowing in the considered cell is lower than such fixed reference current.

Such method 30' proceeds then to the checking step 308-310, configured to check if further write operations, that is, further pulse phases, are needed.

For instance, such checking step 308-310 may comprise the following stages:

a first checking stage 308, configured to receive such results of the execution of write verify operations on each of the cells comprised in any of the groups from each of the verify stages 306, and to check if any of such results indicates that a cell in such cells comprised in any group in the plurality of groups is not correctly set to the desired value, that is, if at least a result indicates an unsuccessful operation, that is, if one or more of the write verify operations fails; and a second checking stage 310, configured to check if there is still any reset/set current pulse left to be used, for instance, by checking if a currently selected reset/set current pulse for performing a set or reset pulse phase, for instance, selected in the first setting step 302 or in an incrementing step 322, is comprised in a set of available reset/set current pulses, for instance, the set of reset/set current pulses shown in FIGS. 2A and 2B, and is labeled as still not used.

If the first checking stage 308 detects that each of the cells comprised in any of the groups is correctly set to the desired value, the method 30' proceeds to an ending step 324 that is configured to end the method 30'.

Otherwise, if one or more cells comprised in any of the groups are not correctly set to the desired value, the method 30' proceeds to the second checking stage 310.

As previously described, the second checking stage 310 is configured to check if there is still any reset/set current pulse left to be used, for instance, if each of the current pulses is associated to a number, the second checking stage 310 may be configured to check if the variable containing the pulse counter value is higher than three (the number of considered current pulses in the embodiments of FIGS. 2A and 2B) and, if such a condition is satisfied, the second checking stage 310 is configured to determine that each of the current pulses has already been considered.

Alternatively, if each of the pulses is associated to a corresponding flag, the second checking stage 310 may be configured to check if the value of each of the flags corresponds to a value indicating that the corresponding pulse has already been considered and, if such a condition is satisfied, the second checking stage 310 is configured to determine that each of the pulses has already been considered.

If the second checking stage 310 detects that each of the reset/set current pulses has already been used, the method 30' proceeds to the second setting step 312 that is configured to indicate the failure of the corresponding write operation, for instance, by setting the value of a failure variable to a high logic level and, optionally, sending such failure variable to an internal and/or external control unit, for instance, to any type of elaboration unit as a processor, a microprocessor, a microcontroller, a logic unit, or the like, even distributed, for instance, the control unit CU of the PCM, then the method 30' proceeds to the ending step 324 that is configured to end the method 30'.

Otherwise, if at least the selected reset/set current pulse, for instance, selected in the first setting step 302 or in the incrementing step 322, is still to be used, for instance, since it is labelled as still to be used, the method 30' proceeds to a first switching step 314, such first switching step 314 being configured to modify a configuration and/or configuration parameters of the PCM in order to switch from a write verify operation to a set write operation.

Then, the set pulse step 3161 is performed, such set pulse step 3161 being configured to generate a set current pulse with the features of the currently selected set current pulse, for instance, the set current pulse selected in the first setting step 302 or a set current pulse selected in the incrementing step 322, and to apply such generated set current pulse to each of the cells that are not correctly set to a high logic level, that is, that should be set to a high logic level but instead are currently set to a low logic level, irrespective of their group.

A second switching step 318 is configured to modify the configuration and/or configuration parameters of the PCM in order to switch from the set write operation to a reset write operation.

The reset pulse step 3162 is then performed, such reset pulse step 3162 being configured to generate a reset current pulse with the features of the currently selected reset current pulse, for instance, the reset current pulse selected in the first setting step 302 or a reset current pulse selected in the incrementing step 322, and to apply such generated reset current pulse to each of the cells that are not correctly set to a low logic level, that is, that should be set to a low logic level but instead are currently set to a high logic level, irrespective of their group.

A third switching step 320 is configured to modify the configuration and/or configuration parameters of the PCM in order to switch from the reset write operation to a write verify operation, and then the method 30' proceeds to the incrementing step 322.

The incrementing step 322 is configured to label both the currently selected set current pulse and the currently selected reset current pulse as already been used and to select the next set current pulse in a sequence of set current pulses, for instance, the sequence of set current pulses PS of FIG. 2B, and the next reset current pulse in a sequence of reset current pulses, for instance, the sequence of reset current pulses PR of FIG. 2A, if such next set and reset current pulses are labeled as still not used.

For example, if each of the current pulses is associated to a number, the incrementing step 322 is configured to increment the pulse counter value in order to change the labeling of the currently selected reset/set current pulses in already been used and selecting the reset/set current pulses corresponding to the incremented value of the pulse counter value as new currently selected reset/set current pulses.

Alternatively, if each of the pulses is associated to a corresponding flag, the incrementing step 322 is configured to change the flag value of the currently selected reset/set current pulses to indicate that such current pulses have already been considered, and to select, for instance, following a predetermined order, different reset/set current pulses that have not been considered yet as new currently selected reset/set current pulses.

For instance, if each of the pulses is associated to a corresponding flag, an example of a predetermined order to choose the next reset/set current pulses to be considered as new currently selected reset/set current pulses may be:

the order of the set current pulses selected as currently selected set current pulse for performing a next set pulse phase is (from the first to the last): the first set pulse $PS_1$, the second set pulse $PS_2$, and the third set pulse $PS_3$;

the order of the reset current pulses selected as currently selected reset current pulse for performing a next reset pulse phase is (from the first to the last): the first reset pulse $PR_1$, the second reset pulse $PR_2$, and the third reset pulse $PR_3$; and if each of the reset/set current pulses within such sequences of reset/set current pulses is labeled as already been used any selection may be possible (even not selecting next reset/set current pulses) as the method 30' ends with a failure once the second checking stage 310 is reached again, before performing further pulse steps 3161 and 3162.

In various embodiments, the next reset/set current pulses to be considered as new currently selected reset/set current pulses is selected in response to a failed set write operation 3161 and/or a failed reset write operation 3162, and further set write operations 3161 and/or further reset write operations 3162 are performed using set PS or reset PR current pulses, respectively, of increased value.

After such incrementing step 322, the method 30' is configured to return to the verify setup step 304.

Solutions as described herein facilitate achieving a method for performing PCM write operations, that is, to write a word comprising one or more bits, including write verify operations, in a Phase Change Memory (PCM)

device, the PCM device comprising a plurality of groups ("sets") of cells configured to have written therein, in response to a write operation, for instance, a set write operation or a reset write operation, a binary logic level selected from a high logic level and a low logic level, wherein each cell is included in a respective group ("set") of cells in the plurality of groups ("sets") of cells.

Therefore, embodiments of the method as described herein comprise performing (at least) the following steps:
performing, on the cells in such plurality of groups ("sets") of cells, write verify operations configured to provide results indicative of an actual logic level stored in the cells in such plurality of groups ("sets") wherein the write verify operations are performed on each cell with a set of parameters selected as a function of the respective group ("set") of cells including the cell;
checking, based on the results from such write verify operations, if the actual logic level stored in the cells in such plurality of groups ("sets") matches such binary logic level; and
in response to such checking determining that in at least one cell in such plurality of groups ("sets") the actual logic level fails to match such binary logic level, correcting such actual logic level to match such binary logic level via:
a set write operation in case the binary logic level is a high logic level, or
a reset write operation in case the binary logic level is a low logic level.

Thus, solutions as described herein facilitate reducing current variations within cells in order to facilitate write verify operations, that is, operations to check the success of write operations, achieving write operations with increased performances.

In addition, solutions as described herein may improve accuracy of write verify operations as the word line $WL_j$ IR drop may be considered about constant in each of the operations.

Then, the reduction of the number of switching operation, for instance, such first switching step 220 and such second switching step 224, may further reduce the time needed for performing a write operation, as the time needed for such switching operations is reduced, and also the consumption of the PCM and/or related devices may be decreased.

The time taken in performing a write operation may be even further reduced through the parallelization of: set write operation for direct and complementary cells; and reset write operation for direct and complementary cells.

Without prejudice to the underlying principles, the details and the embodiments may vary, even significantly, with respect to what has been described by way of example only without departing from the scope of the embodiments.

The claims are an integral part of the technical teaching provided in respect of the embodiments.

The extent of protection is determined by the annexed claims.

The invention claimed is:

1. A method of performing write operations in a Phase Change Memory (PCM) device, the PCM device comprising a plurality of sets of cells configured to have written therein, in response to a write operation, a binary logic level selected from a high logic level and a low logic level, wherein each cell is included in a respective set of cells in the plurality of sets of cells, the method comprising:
performing, on the cells in said plurality of sets of cells, write verify operations configured to provide results indicative of an actual logic level stored in the cells in said plurality of sets wherein the write verify operations are performed on each cell with a set of parameters selected as a function of the respective set of cells including the cell;
wherein performing write verify operations comprises:
performing first write verify operations on first cells in said plurality of sets of cells by checking if a current flowing through each first cell subjected to the first write verify operation is higher than a first reference current having a first direction of inequality; and
performing second write verify operations on second cells in said plurality of sets of cells by checking if a current flowing through each second cell subjected to the second write verify operation is lower than a second reference current having a second direction of inequality;
checking, based on the results from said write verify operations, if the actual logic level stored in the cells in said plurality of sets matches said binary logic level;
wherein checking comprises:
determining that the actual logic level stored in the first cells in said plurality of sets of cells fails to match said binary logic level in response to the current flowing through the first cell subjected to first write verify operation being lower than the first reference current; and
determining that the actual logic level stored in the second cells in said plurality of sets of cells fails to match said binary logic level in response to the current flowing through the second cell subjected to second write verify operation being higher than the second reference current; and
in response to said checking determining that in at least one cell in said plurality of sets the actual logic level fails to match said binary logic level, correcting said actual logic level to match said binary logic level by performing one of:
a set write operation in case the binary logic level is a high logic level, and
a reset write operation in case the binary logic level is a low logic level.

2. The method according to claim 1, wherein said PCM device is a two-cells-per-bit Phase Change Memory (PCM) device.

3. The method according to claim 1, wherein the plurality of sets of cells comprises:
a set of direct cells, wherein each direct cell is configured to have written therein a direct bit value equal to one of said high logic level and low logic level; and
a set of complementary cells, wherein each complementary cell is coupled to a respective direct cell in the set of direct cells, and wherein each complementary cell is configured to have written therein a complementary bit value equal to the other of said high logic level and low logic level.

4. The method according to claim 3, wherein the direct cells and the complementary cells are arranged in:
a first set comprising direct cells configured to have written therein a direct bit value equal to said high logic level;
a second set comprising complementary cells configured to have written therein a complementary bit value equal to a high logic level;
a third set comprising direct cells configured to have written therein a direct bit value equal to said low logic level; and a fourth set comprising complementary cells configured to have written therein a complementary bit value equal to a low logic level.

5. The method according to claim 4, wherein correcting said actual logic level to match said binary logic level comprises:

performing the set write operation on direct cells comprised in said first set and said second set; and performing reset write operations on complementary cells comprised in said third set and said fourth set.

6. The method according to claim 4:

wherein the write verify operations comprise:

performing said first write verify operations on said first set of direct cells and said second set of complementary cells; and performing said second write verify operations on said third set of direct cells and said fourth set of complementary cells.

7. The method according to claim 6, wherein the first reference current is higher than the second reference current.

8. The method according to claim 1, wherein said set of parameters comprises:

a reference current for comparison with a current flowing through the cell subjected to write verify operation; and a direction of inequality applied in said comparison.

9. The method according to claim 1, wherein the first reference current is higher than the second reference current.

10. The method according to claim 1, comprising, in response to a failed set write operation and/or a failed reset write operation, repeating set write operations and/or reset write operations with set or reset current pulses, respectively, of increased value.

11. A Phase Change Memory (PCM) device comprising a plurality of sets of cells configured to be set to given logic levels in response to write operations, the PCM device being configured to implement the method according to claim 1.

12. A computer program product loadable in a control unit of a Phase Change Memory (PCM) device, the PCM device comprising a plurality of sets of cells configured to be set to given logic levels in response to write operations, the computer program product comprising portions of software code configured to cause the PCM device to implement the method according to claim 1 in response to the computer program product being run in the control unit of the PCM device.

13. A method of performing write operations in a Phase Change Memory (PCM) device wherein each bit of data is stored in a pair of memory cells comprising a direct memory cell configured to store a direct bit value equal to one of a set state and a reset state and a complementary memory cell configured to store a complementary bit value equal to the other of said set state and reset state, the method comprising, in response to writing said bit of data to the pair of memory cells:

performing a write verify operation on the pair of memory cells by:

comparing output current from only the direct memory cell of the pair of memory cells to a first reference current to detect whether the direct bit value is incorrectly in the set state;

comparing output current from only the complementary memory cell of the pair of memory cells to the first reference current to detect whether the complementary bit value is incorrectly in the set state;

comparing output current from only the direct memory cell of the pair of memory cells to a second reference current to detect whether the direct bit value is incorrectly in the reset state; and comparing output current from only the complementary memory cell of the pair of memory cells to the second reference current to detect whether the complementary bit value is incorrectly in the reset state; and selectively performing a correction to the pair of memory cells by:

when the direct bit value in the direct memory cell is detected to be incorrectly in the set state, applying a reset write operation to the direct memory cell to program the direct bit value to the reset state;

when the direct bit value in the direct memory cell is detected to be incorrectly in the reset state, applying a set write operation to the direct memory cell to program the direct bit value to the set state;

when the complementary bit value in the complementary memory cell is detected to be incorrectly in the set state, applying a reset write operation to the complementary memory cell to program the complementary bit value to the reset state; and when the complementary bit value in the complementary memory cell is detected to be incorrectly in the reset state, applying a set write operation to the complementary memory cell to program the complementary bit value to the set state.

14. The method according to claim 13, wherein the first reference current is higher than the second reference current.

15. The method according to claim 13, wherein applying a reset write operation comprises applying a reset current pulse to the direct or complementary memory cell to program to the reset state, and wherein applying a set write operation comprises applying a set current pulse to the direct or complementary memory cell to program to the set state.

16. The method according to claim 15, further comprising, in response to a failed reset write operation, repeating the reset write operation with an increased value of the reset current pulse.

17. The method according to claim 15, further comprising, in response to a failed set write operation, repeating the set write operation with an increased value of the set current pulse.

18. A Phase Change Memory (PCM) device configured to implement the method according to claim 13.

19. A computer program product loadable in a control unit of a Phase Change Memory (PCM) device, the computer program product comprising portions of software code configured to cause the PCM device to implement the method according to claim 13 in response to the computer program product being run in the control unit of the PCM device.

\* \* \* \* \*